(12) United States Patent
Peng et al.

(10) Patent No.: US 6,951,817 B2
(45) Date of Patent: Oct. 4, 2005

(54) METHOD OF FORMING AN INSULATOR BETWEEN FEATURES OF A SEMICONDUCTOR DEVICE

(75) Inventors: Shuang-Neng Peng, Sinjhuang (TW); Sheng-Chen Wang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/744,148

(22) Filed: Dec. 22, 2003

(65) Prior Publication Data

US 2005/0136665 A1 Jun. 23, 2005

(51) Int. Cl.⁷ .................. H01L 21/302; H01L 21/461
(52) U.S. Cl. ........................... 438/689; 438/756
(58) Field of Search ................... 438/689, 691, 438/695, 709, 734, 740, 751, 756

(56) References Cited

U.S. PATENT DOCUMENTS 6,258,437 B1 * 7/2001 Jarvis .................... 428/137

* cited by examiner

*Primary Examiner*—Phuc T. Dang
(74) *Attorney, Agent, or Firm*—Slater & Matsil, L.L.P.

(57) ABSTRACT

A method of forming an insulator between features of a semiconductor device. An insulating material such as high-density plasma (HDP) oxide is deposited over and between features formed on a semiconductor device. The height of the insulating material between the features is preferably less than the height of the features. A sputter process or other removal process is used to decrease the insulating material height of the features and decrease the insulating material height between the features. The insulating material is removed from over the top surface of the features, and a chemical-mechanical polish (CMP) process is used to lower the top surface of the features, stopping on the insulating material between the features.

44 Claims, 3 Drawing Sheets

METHOD OF FORMING AN INSULATOR BETWEEN FEATURES OF A SEMICONDUCTOR DEVICE

TECHNICAL FIELD

The present invention relates generally to the fabrication of semiconductor devices, and more particularly to a method of forming an insulator between features of a semiconductor device.

BACKGROUND

Semiconductor devices are fabricated by depositing various material layers, such as conductors, semiconductors, and insulators, and patterning the various material layers to form circuit elements and interconnects therebetween. Some semiconductor devices are arranged in a matrix or array, such as is shown in the prior art perspective view of a semiconductor device 100 in FIG. 1. A plurality of cells 114 are arranged in an array of rows and columns, and a plurality of first conductive lines 112 and second conductive lines 116 running in a different direction than first conductive lines 112 are disposed below and above the array of cells 114, respectively, as shown. The cells 114 are selected by accessing the cells 114 through the first conductive line 112 and second conductive line 116 adjacent the particular cell 114. The cells 114 in the array 100 may comprise memory cells, fuses, or anti-fuses, as examples, although the cells 114 may alternatively comprise other devices or components, for example.

The first conductive lines 112 and second conductive lines 116 may comprise conductive or semiconductive materials, for example. The first conductive lines 112 may comprise a first layer 118 of polysilicon, for example, and a liner 120 disposed over the first layer 118. The liner 120 may comprise TiN, $TiS_x$, or combinations thereof, although alternatively, the liner 120 may also comprise other materials. The plurality of cells 114 may comprise a first conductive layer 122, a cell region 124 disposed over the first conductive layer 122, and a second conductive layer 128 disposed over the cell region 124. The first conductive layer 122 and the second conductive layer 128 may comprise polysilicon, for example. The cell region 124 comprises a memory cell, a fuse, an anti-fuse, or may alternatively comprise other circuit elements.

A prior art method of forming an insulator between cell regions 114 of a semiconductor device 100 will next be described with reference to FIGS. 2 through 4, which show a semiconductor device 100 in a cross-sectional view at various stages of manufacturing. Referring first to FIG. 2, a workpiece 102 is provided. A plurality of first conductive lines 112 comprising polysilicon 118, for example, are formed over the workpiece 102. The first conductive lines 112 may be formed by first depositing a conductive material 118 over the workpiece 102, and depositing an optional liner 122 over the conductive material 118. A photoresist (not shown) is deposited over the optional liner 122 or conductive material 118, if a liner 122 is not used. The photoresist is then patterned, and the photoresist is used as a mask while exposed portions of the liner 122 and conductive material 118 are etched away, leaving the conductive lines 112 formed over the workpiece 102. Alternatively, the first conductive lines 112 may be formed using a damascene process, for example.

The material layers of the cell regions 114 are then deposited and patterned. For example, a first conductive layer 122 may be deposited over the patterned first conductive lines 112, and cell region material 124 is deposited over the first conductive layer 122. A second conductive layer 128 is deposited over the cell region material 124. The first conductive layer 122 and second conductive layer 128 may comprise polysilicon, for example, although other semiconductive or conductive materials may also be used. The second conductive layer 128, the cell region material 124, and the first conductive layer 122 are patterned to form a plurality of cells 114 disposed in an array of rows and columns. To form the cells 114, a photoresist (not shown) may be deposited over the second conductive layer 128, and the photoresist may be patterned with the cell 114 array pattern. The pattern of the photoresist is transferred to the underlying second conductive layer 128, cell region material 124, and first conductive layer 122 by using the photoresist as a mask while exposed portions of the second conductive layer 128, cell region material 124, and first conductive layer 122 are etched away.

High-density plasma (HDP) oxide is an insulator that is commonly used to isolate adjacent structures such as conductive lines 112 and cells 114. In the prior art insulator formation method shown, an HDP oxide 130 is deposited over the cells 114 and plurality of first conductive lines 112, as shown. One characteristic of HDP oxide 130 is that it forms peaks or huts 132 over taller features of the semiconductor device 100. These peaks 132 typically have the shape of a bishop's hat or miter, for example.

In order to make electrical contact to the second conductive layer 128 of the cells 114, the HDP oxide 130 may be removed from the top surface of the second conductive layer 128, as shown in FIG. 3. This may be accomplished by performing a chemical-mechanical polishing (CMP) process, which is adapted to stop on the top surface 136 of the second conductive layer 128. However, if the second conductive layer 128 material comprises polysilicon, which is often the case, the HDP oxide 130 is removed at a faster rate than the second conductive layer 128 material. This is problematic in that after the CMP process, the HDP oxide 130 may comprise a height 134 that is less than the height 136 of the second conductive layer 128. Typical oxide slurries used in CMP processes of the prior art may comprise a polysilicon 128 removal rate of about 4500 Å per minute, and an HDP oxide removal rate of about 2300 Å, for example. Therefore, the oxide-to-poly removal rate ratio may be about 0.51 in the prior art.

It is undesirable for the HDP oxide height 134 to be lower than the height 136 of the conductive material 128 between the cells 114 because this causes a lack of control of the thickness of subsequently formed second conductive lines 116, shown in FIG. 4. To form the second conductive lines 116, a second conductive line material is deposited over the second conductive material 128 of the cells 114. It is also undesirable to have an excess amount of the HDP oxide 130 removed because the CMP process can create defects in the top surface of the HDP oxide 130 between cell regions 114. These defects may include a concave structure of the top surface of the HDP oxide 130, microscratches in the top surface of the HDP oxide 130, and cracks within the HDP oxide 130, as examples.

Therefore, what is needed in the art is a method of forming an insulator between features of a semiconductor device, wherein the insulator is not recessed between adjacent features.

SUMMARY OF THE INVENTION

These and other problems are generally solved or circumvented, and technical advantages are generally achieved, by preferred embodiments of the present invention, which provide a novel method for forming an insulator between features of a semiconductor device. An HDP oxide is deposited over the features of a semiconductor device, wherein the HDP oxide preferably has a high etch-to-deposition (E/D) value. The HDP oxide is deposited so that the height between the features is less than the height of the features. A sputtering process or other removal process is used to decrease the height of the HDP oxide between the features, while simultaneously decreasing the height of HDP oxide peaks or huts formed over the features of the semiconductor device. In addition to the sputtering process mentioned above, a CMP process or other removal process is also used to remove the HDP oxide peaks from the top surface of the features, stopping on the HDP oxide between the features. A top portion of the features is then removed using another CMP process adapted to stop on the HDP oxide between the features.

In accordance with a preferred embodiment of the present invention, a method of forming an insulator includes providing a workpiece, forming a plurality of features over the workpiece, the plurality of features comprising a first height and having a top surface, and depositing an insulator over and between the plurality of features, wherein the insulator forms peaks over the top surface of the plurality of features. The insulator is exposed to a removal process to remove a top portion of the insulator peaks, and the insulator is removed from over the top surface of the plurality of features. The features are lowered to a height coplanar with a height of the insulator between the plurality of features.

In accordance with another embodiment of the present invention, a method of forming an insulator on a semiconductor device includes providing a workpiece, depositing a material layer over the workpiece, and patterning the material layer to form a plurality of features, the plurality of features comprising a first height and having a top surface. An insulator is deposited over the plurality of features and between the plurality of features, wherein the insulator forms peaks over the top surface of the plurality of features, and wherein the insulator between the plurality of features comprises a second height, the second height being less than the first height. The insulator is exposed to a sputter process or other removal process to remove a top portion of the insulator peaks and decrease the second height of the insulator between the plurality of features to a third height. The insulator is removed from over the top surface of the plurality of features. The method includes removing a top portion of the plurality of features, wherein the plurality of features comprise the third height.

In accordance with yet another embodiment of the present invention, a method of isolating conductive lines of a semiconductor device includes providing a workpiece, depositing a material layer over the workpiece, and patterning the material layer to form a plurality of cells, the plurality of cells comprising a first height, having a top surface, and being arranged in an array. A high density plasma (HDP) oxide is deposited over the plurality of cells and between the plurality of cells, wherein the HDP oxide forms peaks over the top surface of the plurality of cells, and wherein the HDP oxide between the plurality of cells comprises a second height, the second height being less than the first height. The HDP oxide is exposed to a sputter process or other removal process to remove a top portion of the HDP oxide peaks and decrease the second height of the HDP oxide between the plurality of cells to a third height. The HDP oxide is removed from over the top surface of the plurality of cells using a first chemical mechanical polish (CMP) process, wherein the first CMP process stops when the top surface of the plurality of cells is reached.

Advantages of embodiments of the present invention include providing a method of isolating features of a semiconductor device, wherein the insulating layer deposited between features comprises substantially the same height as the height of the features.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device having cell regions arranged in an array. Embodiments of the present invention may also be applied, however, to other semiconductor device structures or workpieces having features formed thereon.

FIGS. 5 through 8 show cross-sectional views of a semiconductor device in various stages of manufacturing in accordance with a preferred embodiment of the present invention. A semiconductor device 200 includes a workpiece 202. The workpiece 202 may include a semiconductor substrate comprising silicon or other semiconductor materials covered by an insulating layer, for example. The workpiece may also include other active components or circuits, not shown. The workpiece may comprise silicon oxide over single-crystal silicon, for example. The workpiece may include other conductive layers or other semiconductor elements, e.g. transistors, diodes, etc. Compound semiconductors, GaAs, InP, Si/Ge, or SiC, as examples, may be used in place of silicon.

The workpiece 202 has a plurality of features 212/214 formed thereon, which features 212/214 may be arranged in an array or other configuration. In a preferred embodiment, the workpiece 202 preferably comprises at least two features 212/214 formed thereon.

Figure 1:
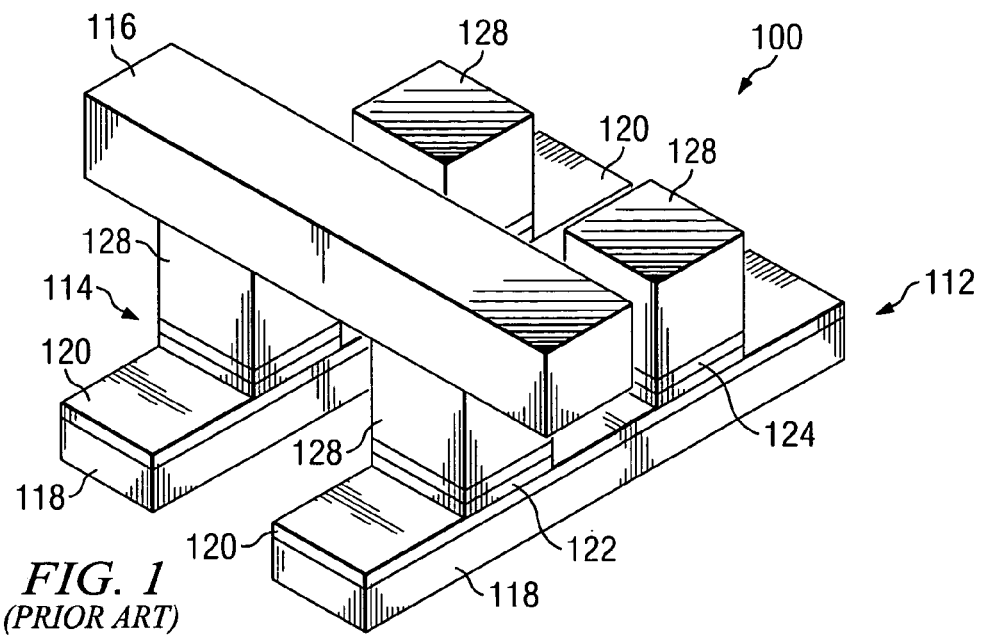
FIG. 1 shows a perspective view of a semiconductor device having cells arranged in an array or matrix.
Figure 2:
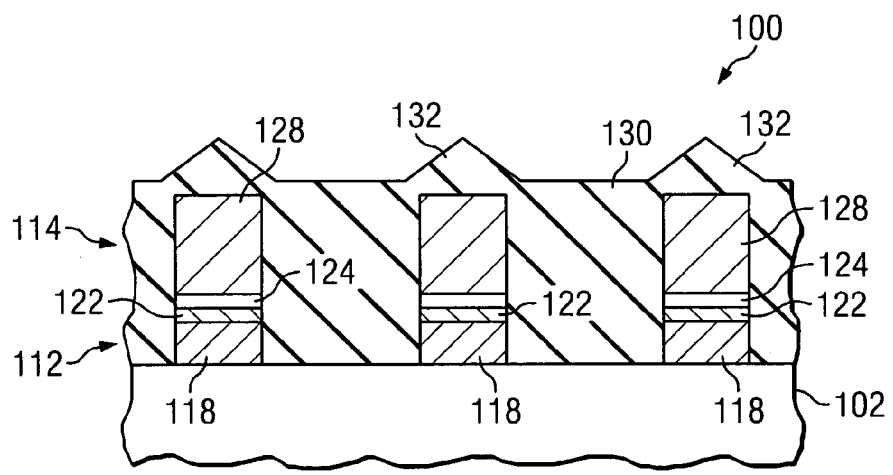
FIGS. 2 through 4 show cross-sectional views of a prior art method of forming an insulating layer between features of a semiconductor device.
Figure 3:
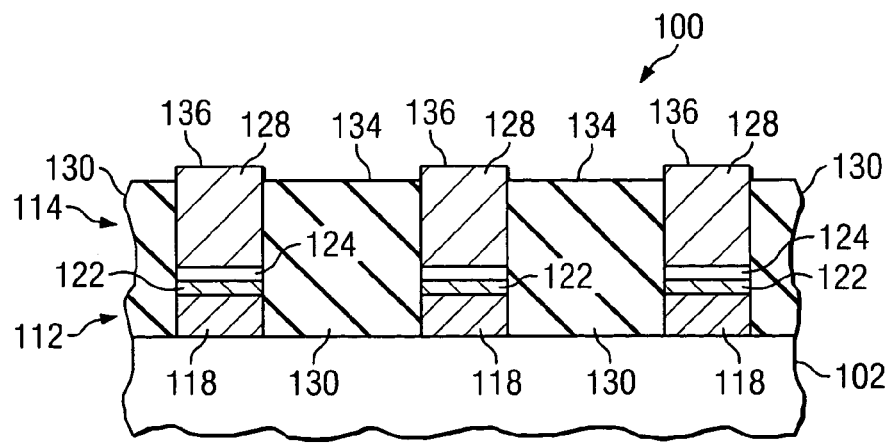

The plurality of features 212/214 preferably comprise a top region of conductive material 228. In one embodiment, the features 212/214 may comprise a plurality of first conductive lines 212 and a plurality of cells 214 formed thereon, as shown in the prior art drawing FIG. 1. The first conductive lines 212 may comprise a conductor or semiconductor such as polysilicon 218, although alternatively, the plurality of first conductive lines 212 may comprise other materials. In one embodiment, the first conductive lines 212 preferably comprise about 2000 Å of P+ polysilicon disposed over the workpiece 202, a layer of $TiS_x$ disposed over the P+ polysilicon, and a layer of TiN disposed over the layer of $TiS_x$, (not shown) as an example. The first conductive lines 212 may alternatively comprise other conductive materials.

The cells 214 may comprise a cell region 224 that may comprise a circuit element such as a memory cell, fuses, antifuses, or other devices. The cells 214 may include a conductive material 228 formed over each cell region 224, as shown. The conductive material 228 may comprise about 3500 Å of undoped polysilicon, and the cell regions 224 may comprise an antifuse disposed over about 500 Å of P+ polysilicon formed over the first conductive lines 212, (not shown) in one embodiment. The conductive material 228 is optional, and the features 212/214 may comprise other structures or materials, for example. The features 212/214 may comprise stacked conductive lines and vias, e.g., a stack of one or more conductive lines and one or more vias coupled to the conductive lines.

Figure 5:
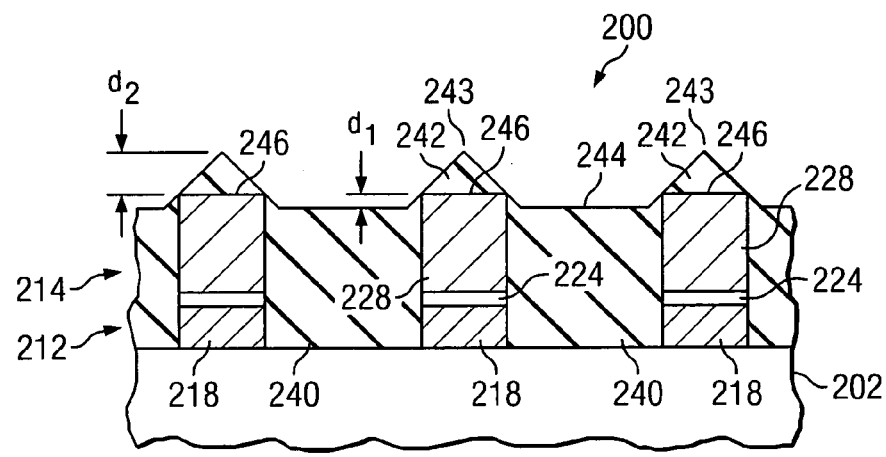
FIGS. 5 through 8 show cross-sectional views of a method of forming an insulating layer in accordance of an embodiment of the present invention.

In accordance with an embodiment of the present invention, an insulating material 240 is deposited over and between the plurality of features 212/214, as shown in FIG. 5. The insulating material 240 preferably comprises a material that forms peaks or huts 242 on a top surface of the features 212/214, while also partially filling the spaces between the features 212/214. In a preferred embodiment, the insulating material 240 comprises HDP oxide. The insulating material 240 preferably comprises a high etch-to-deposition (E/D) value so that the spaces between the features 212/214 are not completely filled and thus, do not reach a first height 246 of the features 212/214. Rather, preferably, the insulating material 240 is adapted to be deposited such that it comprises a second height 244 between adjacent features 212/214, as shown, wherein the second height 244 is preferably less than the first height 246. For example, the first height 246 may be greater than the second height 244 by a distance $d_1$, which may comprise about 450 Angstroms. The peaks 242 over the top surface of the features 212/214 preferably have a height 243 above height 246 of about 300 Angstroms, represented by distance $d_2$.

Figure 6:
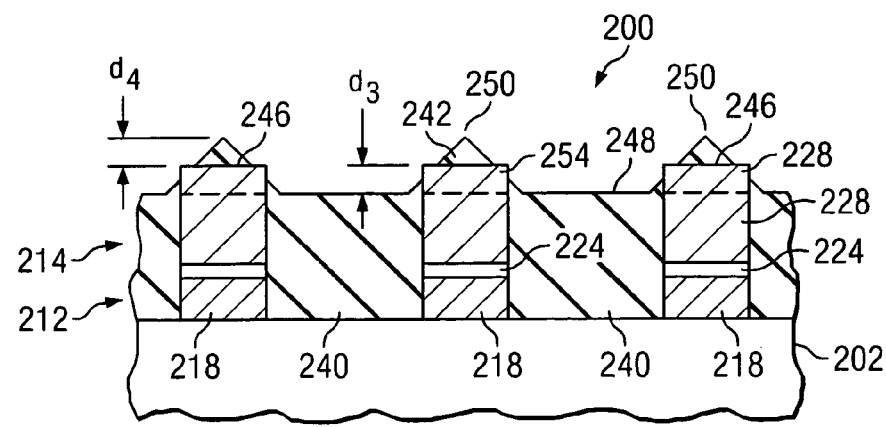

The insulating material 240 is exposed to a sputter process or other removal process, as shown in FIG. 6. The sputter or other removal process may comprise an argon sputter process and may alternatively comprise other removal processes, such as wet and dry etching processes, as examples. The sputter or other removal process may comprise argon physical sputtering induced from high density plasma and RF bias, and alternatively may comprise chemical etching using $SiF_4$ or $SiH_4O_2$, as examples. The sputter or other removal process is adapted to remove a portion of the peaks or huts 242, reducing them to a height 250 that is less than the height 243 of the peaks or huts 242 shown in FIG. 5. The sputter or other removal process may also decrease the height of the insulating material 240 between the features 212/214 to a height 248 that is lower than the height 244 of the insulating material 240 shown in FIG. 5.

In one embodiment, the height 248 is about equal to the height 246 of the plurality of features 212/214 (not shown). In another embodiment, the height 248 is less than the height 246 of the plurality of features 212/214 by a distance of $d_3$. The height 250 of the peaks 242 after the sputter process or other removal process preferably comprises a distance $d_4$ above the height 246 of the features 212/214, wherein distance $d_4$ is less than distance $d_2$ of FIG. 5. Distance $d_3$ may comprise about 0 to 550 Angstroms, and distance $d_4$ may comprise about 0 to 200 Angstroms, as examples. The insulating material 240 is preferably decreased by an amount $(d_3-d_1)$, wherein $(d_3-d_1)$ is about 0 to 100 Angstroms, for example. Note that the top corners of the features 212/214 may be left exposed after the sputter or other removal process, as shown in FIG. 6.

The novel sputter process or other removal process in accordance with embodiments of the present invention is advantageous in that it not only reduces the height of the peaks 242, the height of the insulating material 240 between the features 212/214 may also be slightly decreased. Because the height of the peaks 242 is decreased, the step profile between the top surface of the peaks 242, the top surface of the features 212/214, and the top surface of the insulating material 240 is reduced, improving the results of any subsequent polishing processes and decreasing the likelihood that an excess amount of insulating material 240 will be removed in the subsequent polishing processes.

The semiconductor device 200 is next exposed to a removal process adapted to remove peaks 242 from the top surface of polysilicon structures 228. The removal process may comprise a polishing process such as a CMP process. If a CMP process is used, it is preferably adapted to stop on the top surface of the polysilicon structures 228, for example. Alternatively, a sputter process may be used to remove the insulating material 242 peaks from over the top of the features 212/214.

A top portion 254 (shown in FIG. 6) of polysilicon 228 may optionally be removed during the CMP of the insulating material 240. The features 212/214 in this embodiment may have a reduced height 256, which is less than height 246 of the features 212/214 prior to the CMP process. Alternatively, the features 212/214 may retain height 246 as shown in FIG. 6.

Figure 7:
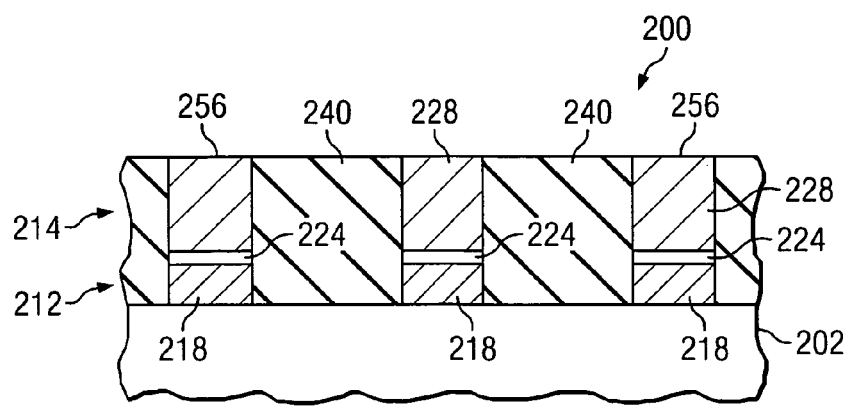

The poly-silicon structures 228 are then exposed to a CMP process that is adapted to stop on oxide 240 to lower the height of the polysilicon structures. The CMP process is used to lower the top surface of the polysilicon structures 228 and remove top portion 254, for example. The CMP process to lower polysilicon structures 228 is preferably adapted to stop on oxide or the material of the insulating material 240, for example, as shown in FIG. 7. Preferably the CMP process is highly selective, e.g., conductor to insulator, so that a minimal amount or no amount of oxide 240 is removed. Thus, a highly planar structure is formed, as shown in FIG. 7, wherein the top surfaces 256 of the polysilicon structures 228 are coplanar with the top surface of insulating material 240.

Preferably, in one embodiment, the CMP process used to lower the height of the polysilicon structures 228 that is adapted to stop on the oxide 240 comprises a polysilicon removal rate of about 4500 Å per minute, and an oxide removal rate of about 80 Å per minute. Thus, the CMP process preferably comprises a poly-to-oxide removal rate ratio of about 56, in this embodiment. The CMP process adapted to stop on the insulating material 240 may alternatively comprise other removal rates of polysilicon, oxide or other materials of the features 212/214 and insulating material 240, for example. The CMP process may comprise a colloidal slurry that introduces fewer defects to the top surface of the insulating material 240, in one embodiment.

Figure 4:
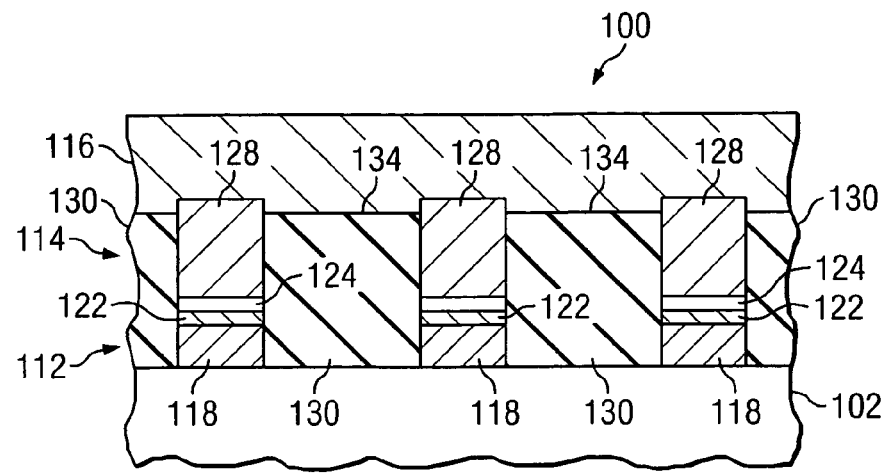
Figure 8:
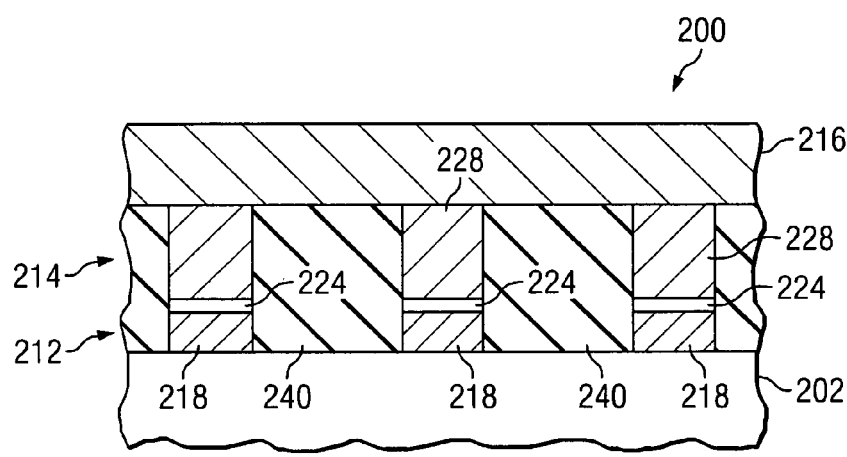

Subsequent processing is then performed on the wafer to complete the manufacturing of the semiconductor device 200. For example, second conductive lines 216 running in a different direction than first conductive lines 212 may then be formed over the top surface of the features 212/214, as shown in FIG. 8 and as described with reference to prior art FIG. 4. Advantageously, because the top surface 256 of the features 212/214 is coplanar with the top surface of the insulating material 240 in accordance with embodiments of the present invention, the thickness of the second conductive lines 216 is controllable.

Figure 9:
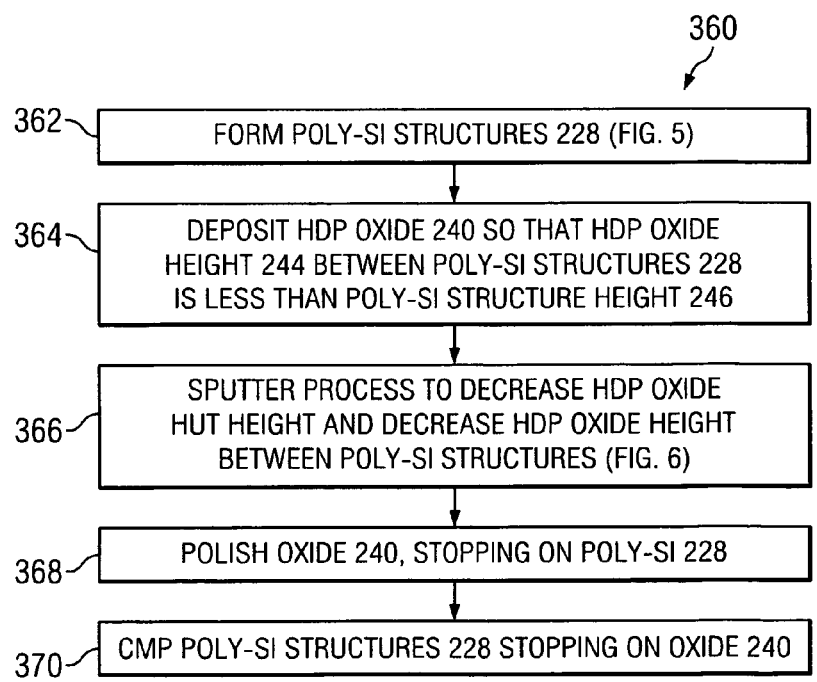
FIG. 9 is a flow chart showing the manufacturing steps of a preferred embodiment of the present invention.

A flow chart 360 illustrating a method in accordance with an embodiment of the present invention is shown in FIG. 9. First, features such as polysilicon structures 228 are formed over a workpiece (step 362; refer also to FIG. 5). An HDP oxide 240 is deposited over the polysilicon structures 228, wherein the HDP oxide height 244 between polysilicon structures 228 is less than polysilicon height 246 (step 364). A sputter process is used to decrease the HDP oxide 240 hut height and also may decrease HDP oxide 240 height between polysilicon structures 228 (step 366; see also FIG. 6). The HDP oxide 240 is then polished or removed from the top surface of the polysilicon structures 228, stopping on the polysilicon 228 (step 368). The polysilicon structures 228 are then exposed to a CMP process, stopping on oxide 240 (step 370).

Advantages of embodiments of the present invention include providing a method of manufacturing a semiconductor device, wherein the features 212/214 and insulating material 240 therebetween have coplanar top surfaces. The insulating material 240 is not recessed beneath the top surface of the features 212/214 between adjacent features 212/214. Wafer-to-wafer uniformity is improved, (e.g., when manufacturing a plurality of wafers in a lot). The recessing of the insulating material 240 and the thickness of subsequently deposited material layers are well controlled. Embodiments of the present invention result in fewer defects, particularly to the top surface of the insulating material 240. Because the height of the HDP oxide 240 peaks or huts are reduced before the CMP processes, this results in reduced time for the CMP process and thus results in reduced cost to manufacture the semiconductor device. Embodiments of the invention comprise using a CMP slurry having a high selectivity of polysilicon to oxide, which easily stops on the polysilicon features and helps control the thickness of the polysilicon features.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an insulator, the method comprising:
providing a workpiece;
forming a plurality of features over the workpiece, the plurality of features comprising a first height and having a top surface;
depositing an insulator between the plurality of features, wherein the insulator forms peaks over the top surface of the plurality of features;
removing a top portion of the insulator peaks from over the top surface of the plurality of features; and
planarizing the workpiece so that the features are coplanar with an insulator height of the insulator between the plurality of features,
wherein the removing the top portion of the insulator peaks comprises exposing the insulator to an argon sputter process, an argon physical sputtering process induced from high density plasma and RF bias, a wet etching process, a dry etching process, a chemical etch process using $SiF_4$, or a chemical etch process using $SiH_4O_2$.

2. A method of forming an insulator, the method comprising:
providing a workpiece;
forming a plurality of features over the workpiece, the plurality of features comprising a first height and having a top surface;
depositing an insulator over and between the plurality of features, wherein the insulator forms peaks over the top surface of the plurality of features, wherein depositing the insulator comprises depositing the insulator at a second height between the plurality of features, wherein the second height is less than the first height;
exposing the insulator to a removal process to remove a top portion of the insulator peaks;
removing the insulator from over the top surface of the plurality of features; and
lowering the features to a height coplanar with a height of the insulator between the plurality of features.

3. The method according to claim 2, wherein exposing the insulator to the removal process comprises removing a portion of the insulator over the insulator between the plurality of features, decreasing the second height to a third height.

4. The method according to claim 3, wherein the third height is about equal to or less than the first height.

5. The method according to claim 3, wherein the third height is less than the second height by about 0 to 100 Angstroms.

6. The method according to claim 3, wherein removing the insulator from over the top surface of the plurality of features comprises a chemical mechanical polish (CMP) process.

7. The method according to claim 6, wherein the CMP process stops when the top surface of the features is reached.

8. The method according to claim 2, wherein forming the plurality of features comprises depositing a semiconductive or conductive material.

9. The method according to claim 2, wherein removing the insulator from over the top surface of the plurality of features comprises a chemical mechanical polish (CMP) process.

10. The method according to claim 9, wherein the CMP process stops when the top surface of the plurality of features is reached.

11. A method of forming an insulator, the method comprising:
providing a workpiece;
forming a plurality of features over the workpiece, the plurality of features comprising a first height and having a ton surface;
depositing an insulator over and between the plurality of features, wherein the insulator forms peaks over the top surface of the plurality of features;
exposing the insulator to a removal press to remove a top portion of the insulator peaks;
removing the insulator from over the top surface of the plurality of features; and
lowering the features to a height coplanar with a second height of the insulator between the plurality of features, wherein lowering the features to a height coplanar with the second height of the insulator between the plurality of features comprises polishing the top surface of the plurality of features.

12. The method according to claim 11, wherein polishing the top surface of the plurality of features comprises a chemical mechanical polish (CMP) process.

13. The method according to claim 12, wherein the CMP process stops when a top surface of the insulator between the plurality of features is reached.

14. The method according to claim 12, wherein a top portion of the plurality of features is removed during the polishing of the top surface of the plurality of features.

15. The method according to claim 11, wherein forming the plurality of features comprises forming a plurality of cells.

16. A method of forming an insulator on a semiconductor device, the method comprising:
providing a workpiece;
depositing a material layer over the workpiece;
patterning the material layer to form a plurality of features, the plurality of features comprising a first height and having a top surface;
depositing an insulator over the plurality of features and between the plurality of features, wherein the insulator forms peaks over the top surface of the plurality of features and wherein the insulator between the plurality of features comprises a second height, the second height being less than the first height;
exposing the insulator to a sputter process or other removal process to remove a top portion of the insulator peaks and decrease the second height of the insulator between the plurality of features to a third height;
removing the insulator from over the top surface of the plurality of features; and
removing a top portion of the plurality of features.

17. The method according to claim 16, wherein the second height is less than the first height by about 450 Angstroms.

18. The method according to claim 16, wherein exposing the insulator to the sputter process or other removal process comprises exposing the insulator to an argon sputter process, an argon physical sputtering process induced from high density plasma and RF bias, a wet etching process, a dry etching process, a chemical etch process using $SiF_4$, or a chemical etch process using $SiH_4O_2$, and wherein removing the top portion of the plurality of features comprises a chemical mechanical polish (CMP) process adapted to stop on the insulator.

19. The method according to claim 16, wherein the third height is about equal or less than the first height.

20. The method according to claim 16, wherein the third height is less than the second height by about 0 to 100 Angstroms.

21. The method according to claim 16, wherein removing the insulator from over the top surface of the plurality of features comprises a chemical mechanical polish (CMP) process.

22. The method according to claim 21, wherein the CMP process stops when the top surface of the features is reached.

23. The method according to claim 16, wherein depositing the material layer comprises depositing a semiconductive or conductive material.

24. The method according to claim 23, wherein depositing the material layer comprises depositing polysilicon.

25. The method according to claim 16, wherein depositing the insulator comprises depositing an oxide.

26. The method according to claim 25, wherein depositing the insulator comprises depositing high-density plasma (HDP) oxide.

27. The method according to claim 16, wherein removing the top portion of the plurality of features comprises polishing the top surface of the plurality of features.

28. The method according to claim 27, wherein polishing the top surface of the plurality of features comprises a chemical mechanical polish (CMP) process.

29. The method according to claim 28, wherein the CMP process stops when the third height of the insulator is reached.

30. The method according to claim 28, wherein the CMP process is adapted to stop on the insulator.

31. The method according to claim 16, wherein depositing the material layer comprises depositing a conductive material, and wherein forming the plurality of features comprises forming a plurality of cells arranged in an array in the conductive material.

32. A method of isolating conductive lines of a semiconductor device, the method comprising:
providing a workpiece;
depositing a material layer over the workpiece;
patterning the material layer to form a plurality of cells, the plurality of cells comprising a first height, having a top surface, and being aged in an array;
depositing high density plasma (HDP) oxide over the plurality of cells and between the plurality of cells, wherein the HDP oxide forms peaks over the top surface of the plurality of cells, wherein the HDP oxide between the plurality of cells comprises a second height, the second height being less than the first height;

exposing the HDP oxide to a sputter process or other removal process to remove a top portion of the HDP oxide peaks and decrease the second height of the HDP oxide between the plurality of cells to a third height; and removing the HDP oxide from over the top surface of the plurality of cells using a first chemical mechanical polish (CMP) process, wherein the first CMP process stops when the top surface of the plurality of cells is reached.

33. The method according to claim 32, wherein the second height is less than the first height by about 450 Angstroms.

34. The method according to claim 32, wherein exposing the HDP oxide to the sputter process or other removal process comprises exposing the HDP oxide to an argon sputter process, an argon physical sputtering process induced from high density plasma and RF bias, a wet etching process, a dry etching process, a chemical etch process using $SiF_4$, or a chemical etch process using $SiH_4O_2$.

35. The method according to claim 32, wherein the third height is about equal or less than the first height.

36. The method according to claim 32, wherein the third height is less than the second height by about 0 to 100 Angstroms.

37. The method according to claim 32, wherein depositing the material layer comprises depositing polysilicon.

38. The method according to claim 32, further comprising polishing the top surface of the plurality of cells with a second CMP process.

39. The method according to claim 38, wherein the second CMP process stops when the second height of the HDP oxide is reached.

40. The method according to claim 38, wherein a top portion of the plurality of cells is removed during the second CMP process.

41. The method according to claim 1, wherein the planarizing comprises lowering the features to make the top surface of the features coplanar with the insulator between the features.

42. The method according to claim 1, wherein prior to the removing the insulator over the top surface of the features, the insulator height for the insulator between the features is less than or equal to the first height of the features.

43. The method according to claim 1, wherein prior to the planarizing, the insulator height for the insulator between the features is less than or equal to the first height of the features.

44. The method according to claim 1, wherein prior to the planarizing, the insulator height for the insulator between the features is greater than the first height of the features.

* * * * *

UNITED STATES PATENT AND TRADEMARK OFFICE
CERTIFICATE OF CORRECTION

PATENT NO.    : 6,951,817 B2  
DATED         : October 4, 2005  
INVENTOR(S)   : Peng et al.

Page 1 of 1

It is certified that error appears in the above-identified patent and that said Letters Patent is hereby corrected as shown below:

<u>Column 9,</u>
Line 27, delete "ton" and insert -- top --.
Line 31, delete "press" and insert -- process --.

Signed and Sealed this

Twenty-ninth Day of November, 2005

JON W. DUDAS
*Director of the United States Patent and Trademark Office*